United States Patent [19]

Hong

[11] Patent Number: 5,413,946
[45] Date of Patent: May 9, 1995

[54] METHOD OF MAKING FLASH MEMORY CELL WITH SELF-ALIGNED TUNNEL DIELECTRIC AREA

[75] Inventor: Gary Hong, Hsin-Chu, Taiwan, Prov. of China

[73] Assignee: United Microelectronics Corporation, Hsinchu, Taiwan, Prov. of China

[21] Appl. No.: 304,119

[22] Filed: Sep. 12, 1994

[51] Int. Cl.[6] .......................................... H01L 21/266
[52] U.S. Cl. ........................................ 437/35; 437/43; 437/44; 437/984
[58] Field of Search ...................... 437/35, 43, 44, 984; 257/321

[56] References Cited

U.S. PATENT DOCUMENTS 5,360,751 11/1994 Lee ........................................ 437/35
5,371,028 12/1994 Koh ........................................ 437/43

*Primary Examiner*—Olik Chaudhuri
*Assistant Examiner*—Richard A. Booth
*Attorney, Agent, or Firm*—George O. Saile

[57] ABSTRACT

This invention provides a stacked gate flash memory cell structure and a method for forming the stacked gate flash memory structure. The invention uses a large angle ion implant beam without wafer rotation to form the source and drain regions of the memory cell. A low doped region is formed between an edge of the first gate electrode and an edge of either the source or drain regions. The tunnel dielectric is formed directly above the low doped region. The width of the low doped region is controlled by the angle of the large angle ion implant beam and can be very accurately controlled. The tunnel dielectric is formed independently of the gate dielectric and the thickness of each can be optimized. The tunnel dielectric area can be made very small which improves reliability and reduces the voltage necessary to program and erase the memory cell.

14 Claims, 5 Drawing Sheets

METHOD OF MAKING FLASH MEMORY CELL WITH SELF-ALIGNED TUNNEL DIELECTRIC AREA

BACKGROUND OF THE INVENTION (1) Field of the Invention

This invention relates to a stacked gate flash memory cell structure and process which uses a large angle ion implant beam to form the source and drain regions in the cell. A low doped region is formed between the edge of either the source or drain and the edge of the first gate electrode. The tunnel dielectric is grown over this low doped region and is self-aligned with it. This method provides a self-aligned very small tunnel dielectric area.

(2) Description of Related Art

Conventional stacked gate flash memory cell structures have the disadvantage of a large tunnel dielectric area which requires large voltages for programming and erase operations of the memory cell. In addition larger tunnel dielectric areas introduce more defects and lower device yield. Often the tunnel dielectric is the same dielectric as the gate dielectric which leads to a compromise between gate dielectric thickness and tunnel oxide thickness.

This invention has the advantage of a tunnel dielectric which is independent of the gate dielectric and the thickness of each can be optimized. In this invention the tunnel dielectric is self-aligned to the source and gate and has a width that can be accurately controlled.

SUMMARY OF THE INVENTION

It is a principle object of the invention to provide a method of forming a stacked gate flash memory cell with a smaller tunnel dielectric area than can be achieved using conventional processing.

It is another object of the invention to provide a stacked gate flash memory cell with smaller tunnel dielectric area than can be achieved using conventional methods.

A smaller tunnel dielectric area requires a lower voltage for programming and erasing operations in the memory cell. A smaller tunnel dielectric area also reduces defects and improves device yield.

These objectives are achieved by using a self-aligned method of forming the tunnel dielectric region which permits the tunnel dielectric region to be kept small while maintaining critical dimensional tolerances. A oblique angle ion implant beam is used to form the N+ source and drain regions of the flash memory cell using the first gate electrode as a mask. This results in either the source or drain region extending under one edge of the first gate electrode and a gap width between an edge of either the source or drain region, whichever does not extend under the first gate electrode, and an edge of the first gate electrode. Normally directed ion implantation is then used to form an N− low doped region in the gap width. The width of the low doped region can be accurately controlled by adjusting the angle of the oblique angle ion implant beam. There is no wafer rotation when the oblique angle ion implant beam is used.

A thermal oxide is then grown which will become the tunnel dielectric or tunnel oxide region and a self-aligned thick oxide region. The thermal oxide grows faster over the N+ source and drain regions than over the N− light doped region. The tunnel oxide is the thin oxide formed over the light doped region. The width of the tunnel oxide is controlled by the width of the light doped region. The width of the light doped region is accurately controlled by the angle of the large angle ion implant beam. The accuracy with which the width of the tunnel oxide region can be controlled and the self-aligned nature of the tunnel oxide region are both important in achieving a very small tunnel oxide width.

The flash memory cell uses a floating gate and a control gate structure. When a suitable potential is applied to the control gate, which is also the Word line, while grounding the source or drain, whichever is formed adjacent to the light doped region, electrons are injected into the floating gate from the source or drain, whichever is formed adjacent to the light doped region, through the tunnel oxide. When a suitable potential is applied to the source or drain, whichever is formed adjacent to the light doped region, while grounding the control gate electrons are injected from the floating gate into the source or drain, whichever is formed adjacent to the light doped region, through the tunnel oxide. Smaller tunnel oxide areas require smaller voltages for the programming and erase operations just described.

DESCRIPTION OF THE PREFERRED EMBODIMENTS

Figure 1:
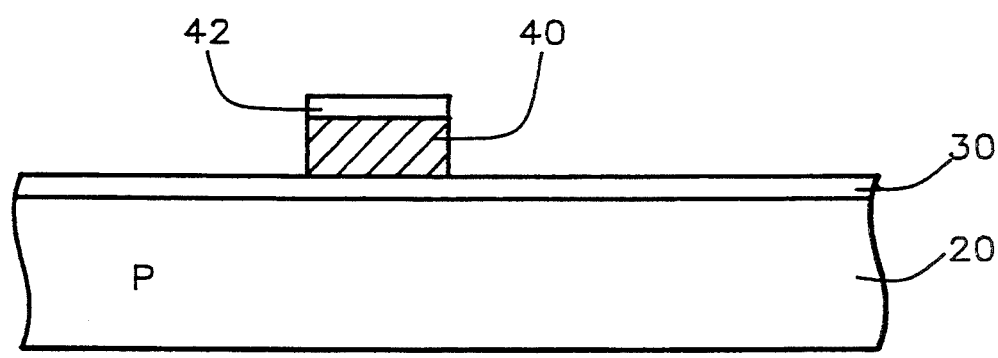
FIG. 1 is a cross section view of the flash memory cell after formation of the first gate electrode with a nitride layer.

Refer now to FIG. 1 through FIG. 7, there is shown the principle embodiment for the method of forming the flash memory cell with self-aligned tunnel dielectric area. FIG. 1 shows a P type silicon substrate 20 with a layer of gate oxide 30, such as $SiO_2$, with a thickness of between about 200 Angstroms and 1000 Angstroms formed on the silicon substrate 20. A polysilicon first gate electrode 40 is formed on the layer of gate oxide and a nitride layer 42 is formed on the first gate electrode. At this stage of the process the first gate electrode 40 extends over a number of adjacent memory cells in order to serve as a mask for the formation of the source, drain, and light doped regions. The first gate electrode will be modified later to be isolated to a single cell. The first gate electrode and nitride layer are formed by means of conventional deposition, photoresist, lithography, and etching methods. Examples of these conventional methods can be found in the book "VLSI PROCESS TECHNOLOGY" Second Edition, by S. M. Sze, published by McGraw-Hill Book Co., New York, N.Y., 1988, pages 221-226 and 223-245.

This embodiment describes a stacked gate flash memory cell where the drain region extends under an edge of the first gate electrode and a gap width is formed between the edge of the source region nearest the first gate and the edge of the first gate electrode nearest the source region. The invention works equally well if the source and drain regions are interchanged.

Figure 2A:
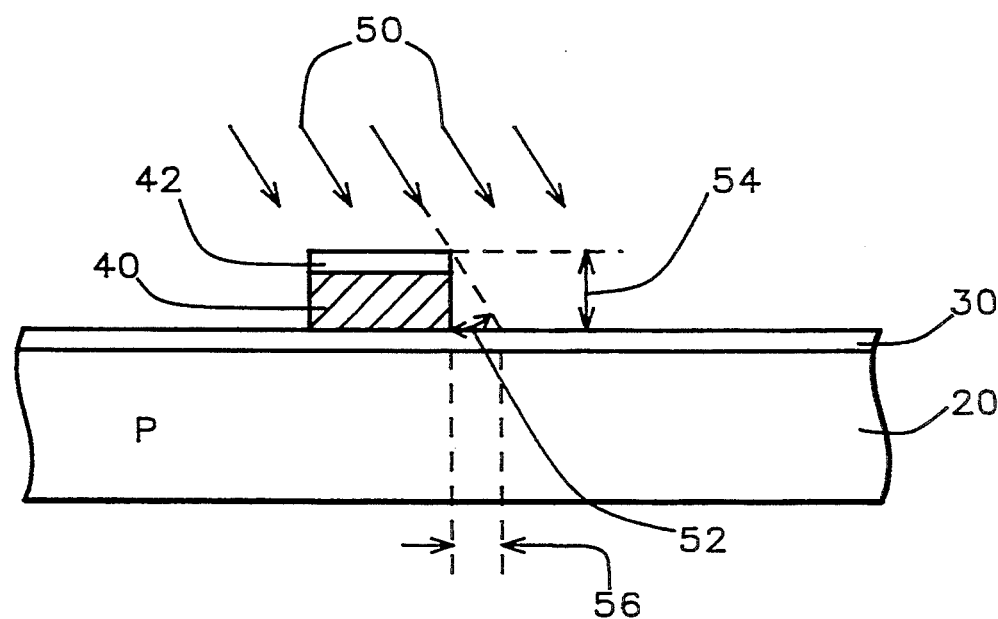
FIG. 2A is a cross section view of the flash memory cell after formation of the first gate electrode with the nitride layer showing the large angle ion implant beam used to form the source and drain regions.
Figure 2B:
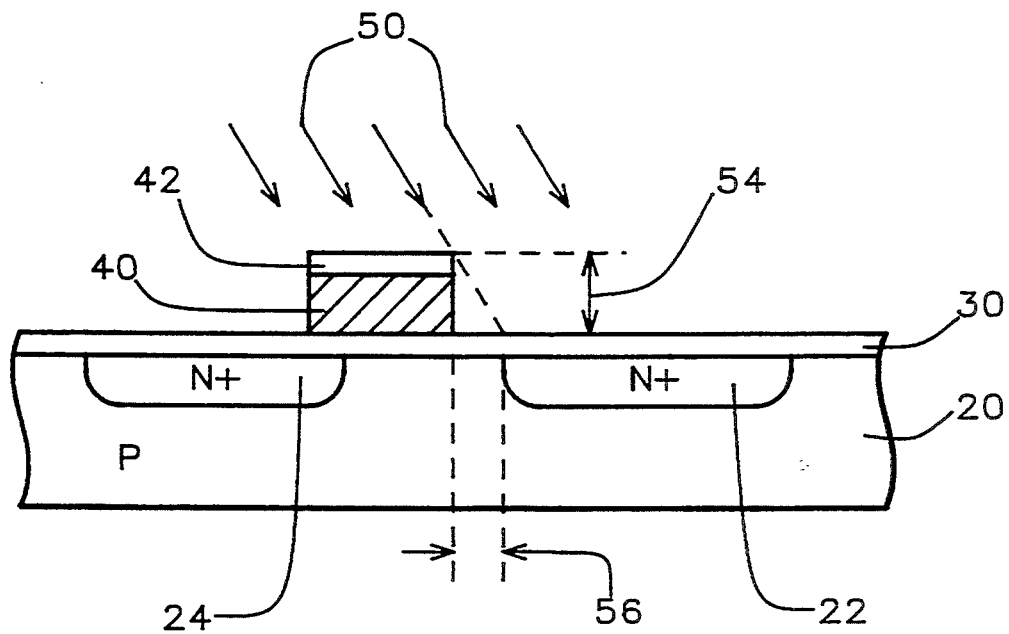
FIG. 2B is a cross section view of the flash memory cell showing the formation of the source and drain regions using the large angle ion implant beam.

Next, as shown in FIG. 2A, a large angle ion implant beam 50 is used to form the source and drain regions. The oblique angle ion implant beam forms an angle 52 of between about 10° and 60° between the beam direction and the sidewall of the first gate electrode. As shown in FIG. 2B N+ source 22 and drain 24 regions are formed using a large angle ion implant beam 50 of arsenic ions with between about $1 \times 10^{15}$ and $8 \times 10^{15}$ ions/cm$^2$ at between about 30 and 100 keV. There is no wafer rotation during this implantation step. As shown in FIG. 2B, one edge of the drain 24 region extends under the edge of the first gate electrode 40 nearest the drain 24 region. There is a gap width 56 between the edge of the first gate electrode 40 nearest the source 22 region and the nearest edge of the source 22 region. The gap width 56 is the tunnel oxide dimension and is between about 0.1 microns and 0.3 microns. The gap width 56 is very nearly equal to the height 54 of the first gate electrode 40 with the nitride layer 42 multiplied by the tangent of the angle 40 between the oblique angle ion beam 50 and the sidewall of the first gate electrode 40.

Figure 3A:
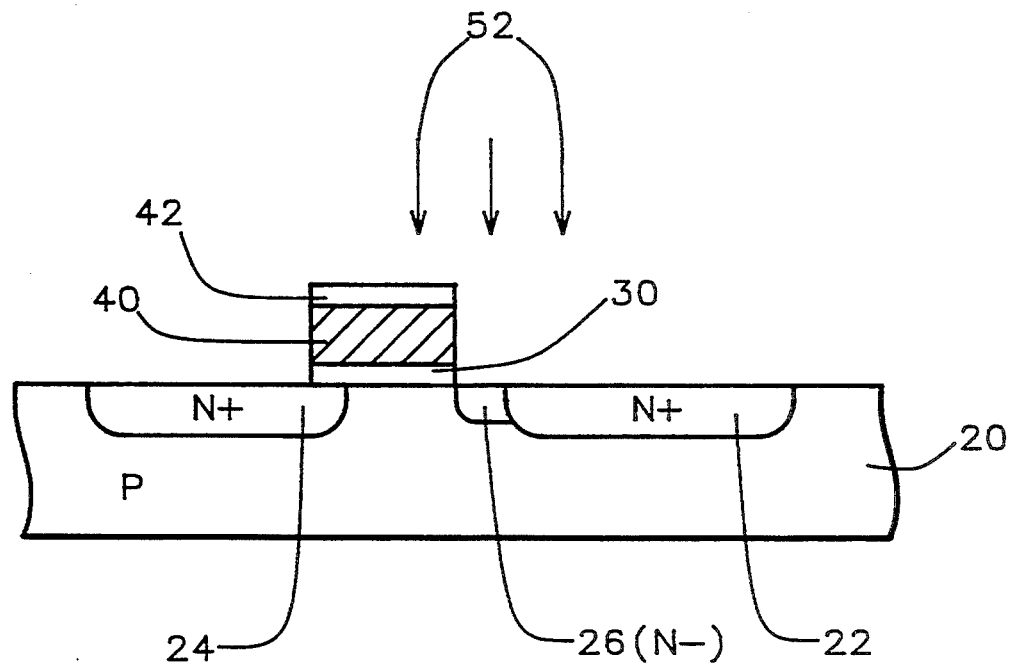
FIG. 3A is a cross section view of the flash memory cell showing the formation of the light doped region using normally directed ion implantation.
Figure 3B:
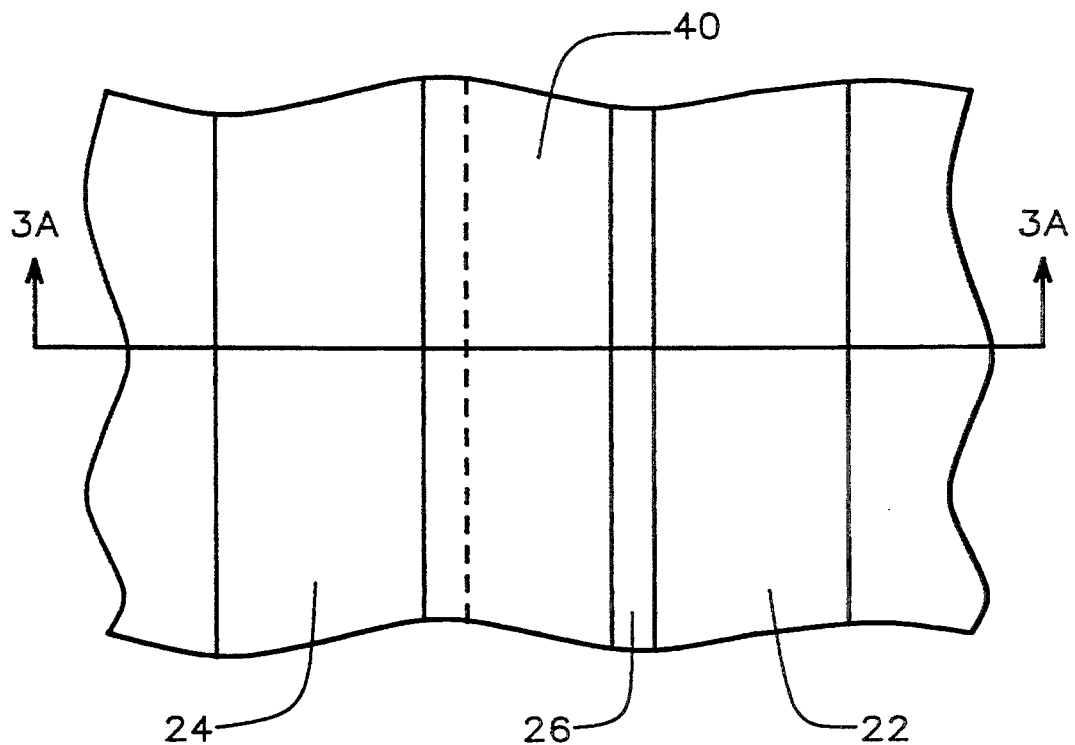
FIG. 3B is a top view of the flash memory cell after formation of the source, drain, and light doped regions.

Next, as shown in FIG. 3A, the gate oxide layer not covered by the first gate electrode is removed by etching using the first gate electrode 40 with the nitride layer 42 as a mask. Next, the N− light doped region 26 is formed between the edge of the first gate electrode 40 nearest the source 22 region and the nearest edge of the source 22 region. The light doped drain region is formed using a normally directed ion beam 52 of phosphorous or arsenic with between about $1 \times 10^{13}$ and $1 \times 10^{14}$ ions/cm$^2$ at between about 30 and 50 keV. The edge of the first gate electrode 40 serves as a mask to determine one edge of the light doped region. FIG. 3B shows the top view of the flash memory cell at this stage of formation showing the first gate electrode 40, the source region 22, the drain region 24, and the light doped drain region 26.

Figure 4:
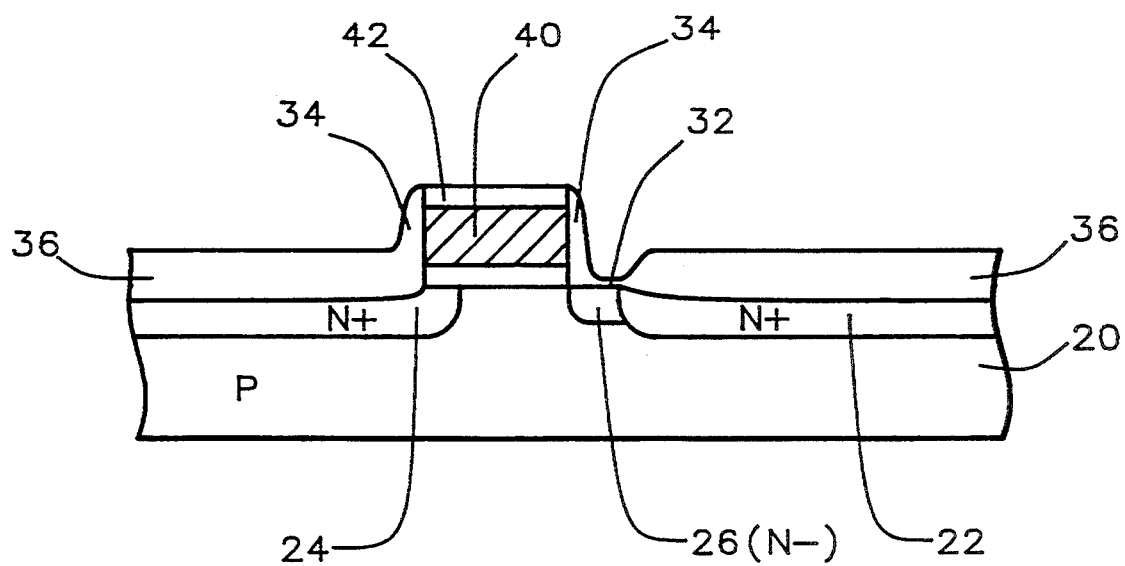
FIG. 4 is a cross section view of the flash memory cell showing the formation of the tunnel oxide, self-aligned thick oxide, and sidewall oxide regions.

Next, as shown in FIG. 4, the side wall oxide 34, the tunnel oxide 32, and the self-aligned thick oxide 36 are formed using thermal oxidation at between about 800° C. and 950° C. The tunnel oxide 32 is between about 60 Angstroms and 100 Angstroms thick. The self-aligned thick oxide is grown at the same time as the tunnel oxide but since it is formed on an N+ region the self-aligned thick oxide grows faster than the tunnel oxide which is formed on an N− region. The self-aligned thick oxide thickness is between about 200 Angstroms and 500 Angstroms.

The tunnel oxide and the self-aligned thick oxide are formed independently of the gate oxide so that the thickness of the gate oxide and the tunnel oxide can both be optimized. Since the self-aligned thick oxide and the tunnel oxide regions are determined by the material they are grown on the self-aligned thick oxide is self aligned to the tunnel oxide and the width of the tunnel oxide region is automatically controlled.

Figure 5:
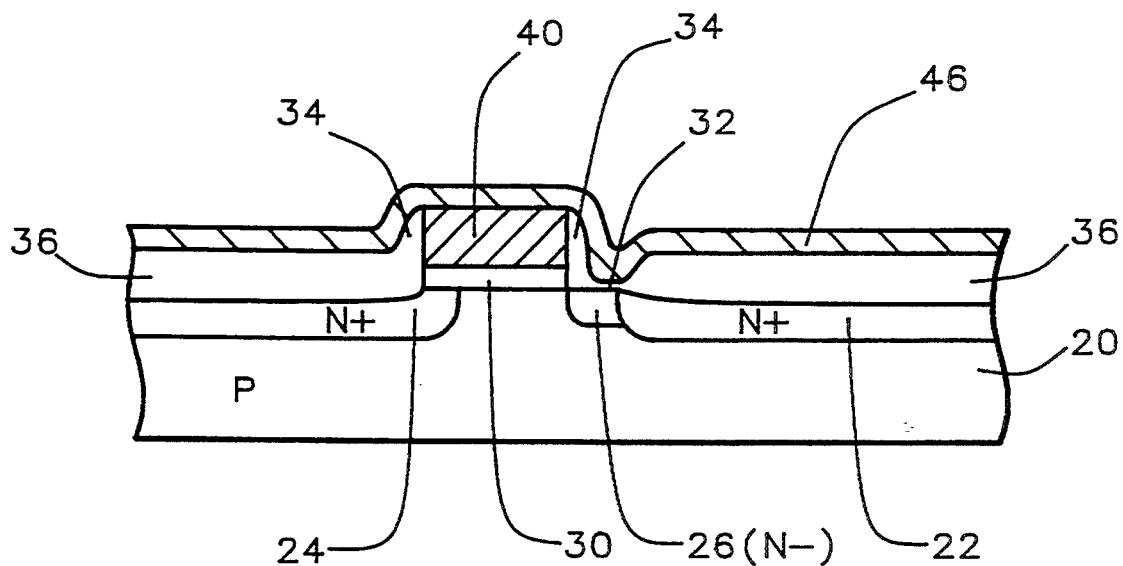
FIG. 5 is a cross section of the flash memory cell after the second gate electrode material has been formed.
Figure 6A:
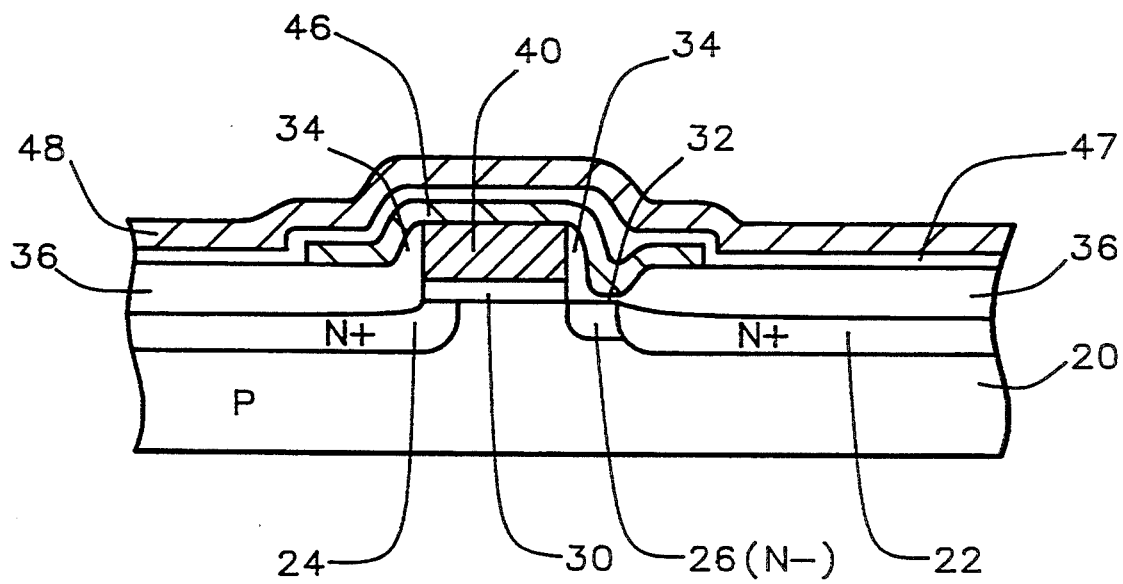
FIG. 6A is a cross section view of the flash memory cell after the second gate electrode has been formed, the oxide/nitride/oxide layer has been formed, and the control gate electrode or word line has been formed.

Next, as shown in FIG. 5, the nitride layer is removed from the first gate electrode and a second polysilicon layer 46 is formed on the silicon substrate using conventional means. The second polysilicon layer 46 forms electrical contact with the first gate electrode 40. Next, as shown in FIG. 6A, the second gate electrode 46 is formed by patterning the second polysilicon layer using conventional means of photoresist, lithography and etching. The first gate electrode 40 is electrically shorted to the second gate electrode 46 and together they will form the floating gate.

Figure 6B:
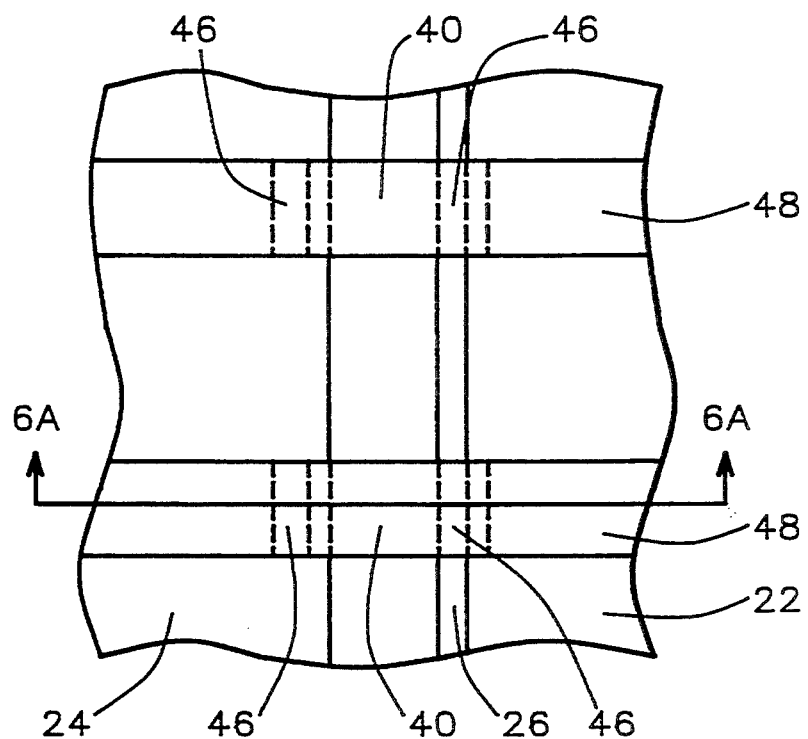
FIG. 6B is a top view of the flash memory cell showing the first gate electrode, the second gate electrode, the control gate electrode, the source, the drain, and the light doped regions.

Next a layer of oxide/nitride/oxide 47 with an effective thickness of between about 100 Angstroms and 300 Angstroms is formed over the second gate electrode by means of conventional chemical vapor deposition and/or thermal oxidation methods. Next a control polysilicon layer is formed on the layer of oxide/nitride/oxide 47. The control gate electrode or word line 48 is then formed by patterning the control polysilicon layer using conventional means of photoresist, lithography and etching. The floating gate is formed from the electrically shorted first gate electrode and second gate electrode and must not extend from one cell to another but must be isolated to a single cell. The etching of the control polysilicon layer to form the control gate electrode or word line is continued through the first and second polysilicon layers to achieve this isolation. Examples of such conventional means are given in the previously cited book by Sze, pages 221-226 and 233-245. FIG. 6B shows the top view of two adjacent flash memory cells showing the word lines 48 at right angles to the source region 22, the drain region 24, and the light doped region 26; and the separation of the floating gate between cells.

Figure 7:
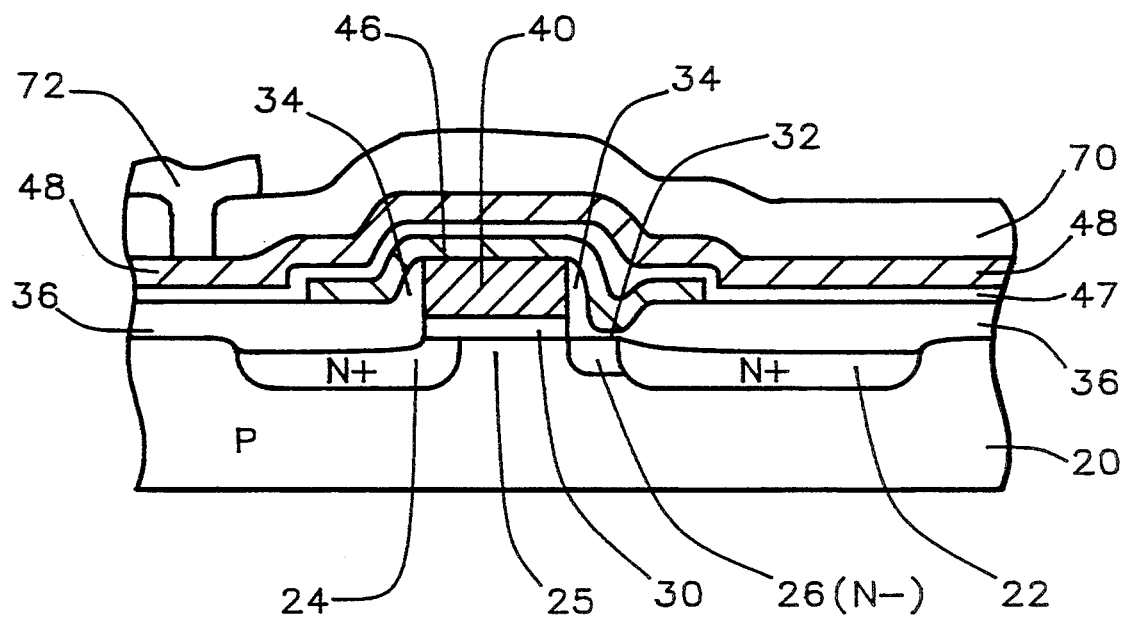
FIG. 7 is a cross section view of the flash memory cell after the insulating dielectric layer and contacts to the control gate electrode have been formed.

Next, as shown in FIG. 7, the flash memory cell is completed by forming an insulation layer such as borophosphosilicate glass 70 over the silicon substrate. Contact openings are formed in the insulation layer to form metal contacts 72 to the word lines 48. A patterned metal conductor layer and a passivation dielectric layer, not shown, are formed on the silicon substrate to complete the formation of the stacked gate flash memory cell device. These completion operations can be accomplished using conventional means.

Refer now to FIG. 6B and FIG. 7, there is shown an embodiment of the flash memory cell with a self aligned tunnel dielectric area. FIG. 7 shows a cross section view of the flash memory cell. The P type silicon substrate 20 has N+ source 22 and drain 24 regions formed therein. One edge of the drain 24 region extends under the polysilicon first gate electrode 40. This embodiment describes a stacked gate flash memory cell where the drain region extends under an edge of the first gate electrode and a gap width is formed between the edge of the source region nearest the first gate and the edge of the first gate electrode nearest the source region. The invention works equally well if the source and drain regions are interchanged. There is an N− light doped region 26 between the edge of the source 22 region nearest the first gate electrode 40 and the edge of the first gate electrode. There is a tunnel oxide area 32, such as SiO2 with a thickness of between about 60 Angstroms and 100 Angstroms, formed directly over the light doped region 26. A self-aligned thick oxide 36, such as SiO2 with a thickness of between about 200 Angstroms and 500 Angstroms, is formed directly over the source 22 region and that part of the drain 24 region which is not under the first gate electrode. A gate oxide 25, such as SiO2 with a thickness of between about 200 Angstroms and 1000 Angstroms, is formed on the silicon substrate and a polysilicon first gate electrode 40, with a thickness of between about 1000 Angstroms and 5000 Angstroms, is formed on the gate oxide 30. A polysilicon second gate electrode 46, with a thickness of between about 500 and 2000 Angstroms, is formed over the first gate electrode 40 after the tunnel oxide 32 and self-aligned thick oxide 36 have been formed and extends over the tunnel oxide 32 and over a portion of the self-aligned thick oxide 36 on both sides of the first gate electrode 40. The second gate electrode 46 makes electrical contact with the first gate electrode 40. A sidewall oxide 34 is formed on the sidewalls of the first gate electrode. A layer of oxide/nitride/oxide 47 with a thickness of between about 100 and 300 Angstroms is formed on the second gate electrode 46. A polysilicon control gate electrode 48, with a thickness of between about 2000 Angstroms and 5000 Angstroms, is formed over the oxide/nitride/oxide 47 layer. The control gate electrode 48 is the word line.

FIG. 6B shows a top view of the flash memory cell. The word line 48 is at right angles to the source 22, the drain 24, and the light doped drain region. Refer again to FIG. 7, an insulating dielectric layer 70, such a borophosphosilicate glass, is formed over the silicon substrate after the word lines 48 have been formed and metal contacts 72 are formed through the insulating dielectric layer 70 to the word line 48. No electrical contact is made to the floating gate, formed from the electrically shorted first gate electrode 40 and second gate electrode 46, and the floating gate for each stacked gate flash memory cell is separate from the floating gates for other stacked gate flash memory cells. A patterned conducting metal layer and passivation dielectric layer, not shown, complete the formation of the flash memory cell.

Referring again to FIG. 7, the first gate electrode 40 and the second gate electrode 46 are electrically connected together and form the floating gate of the flash memory cell. The control gate electrode 48 forms the word line. When a suitable potential is applied to the word line 48 while grounding the source 22 electrons are injected into the floating gate, first gate electrode 40 and second gate electrode 46, from the source 22 through the tunnel oxide 32. When a suitable potential is applied to the source 22 while grounding the word line 48 electrons are injected from the floating gate, first gate electrode 40 and second gate electrode 46, into the source 22 through the tunnel oxide 32. Smaller areas of the tunnel oxide region require lower voltages for the writing and erasing operations just described.

While the invention has been particularly shown and described with reference to the preferred embodiments thereof, it will be understood by those skilled in the art that various changes in form and details may be made without departing from the spirit and scope of the invention.

What is claimed is:

1. A method of forming an improved memory cell, comprising the steps of:
   providing a semiconductor substrate;
   forming a gate dielectric layer on the surface of said semiconductor substrate;
   forming a layer of first gate electrode material on the surface of said gate dielectric layer;
   forming a nitride layer on the surface of said layer of first gate electrode material;
   forming a photoresist layer on the surface of said nitride layer;
   forming a first gate electrode pattern in said photoresist layer;
   forming a first gate electrode with sidewalls and a top surface nitride layer by means of etching said first gate electrode pattern in said layer of first gate electrode material and said nitride layer using said first gate electrode pattern in said photoresist layer as a mask;
   forming heavily doped source and drain regions in said semiconductor substrate by means of a oblique angle ion implantation;
   etching said first gate electrode pattern in said gate dielectric layer using said first gate electrode with sidewalls and a top surface nitride layer as a mask;
   forming a lightly doped region in said semiconductor substrate using normally directed ion implantation;
   forming a sidewall oxide layer on the sidewalls of said first gate electrode;
   forming a tunnel oxide layer over said lightly doped region in said semiconductor substrate;
   forming a self-aligned oxide layer over said source and drain regions in said semiconductor substrate;
   removing said top surface nitride layer from said first gate electrode with sidewalls;
   forming a layer of second gate electrode material on the surface of said semiconductor substrate after said first gate electrode has been formed and said top surface nitride layer has been removed so that said first gate electrode makes electrical contact with said layer of second gate electrode material;
   forming a second gate electrode by etching a second gate electrode pattern in said layer of second gate electrode material using photoresist masking and lithography so that said second gate electrode makes electrical contact with said first gate electrode;
   forming a layer of oxide/nitride/oxide on the surface of said second gate electrode;
   forming a layer of control gate electrode material on said layer of oxide/nitride/oxide;
   forming a control gate electrode by etching a control gate electrode pattern in said layer of control gate electrode material using photoresist masking and lithography;
   forming a floating gate from said first gate electrode and said second gate electrode;
   forming an insulating-dielectric layer on the surface of said semiconductor substrate after said control gate electrode has been formed;
   forming contact openings in said insulating dielectric layer;
   forming metal contacts in said contact openings in said insulating dielectric layer;
   forming a patterned metal conductor layer on the surface of said insulating dielectric layer; and
   forming a passivation dielectric layer on the surface of said insulating dielectric layer after, said patterned metal conductor layer and said metal contacts have been formed.

2. The method of claim 1 wherein said semiconductor substrate is a P conductivity type silicon substrate.

3. The method of claim 1 wherein said layer of first gate electrode material is polysilicon with a thickness of between about 1000 Angstroms and 5000 Angstroms.

4. The method of claim 1 wherein said layer of second gate electrode material is polysilicon with a thickness of between about 500 Angstroms and 2000 Angstroms.

5. The method of claim 1 wherein said layer of control gate electrode material is polysilicon with a thickness of between about 2000 Angstroms and 5000 Angstroms.

6. The method of claim 1 wherein said gate dielectric layer is $SiO_2$ with a thickness of between about 200 Angstroms and 1000 Angstroms.

7. The method of claim 1 wherein said oblique angle ion implant beam forms an angle of between about 10° and 60° with a line normal to the surface of said semiconductor substrate.

8. The method claim 1 wherein there is no rotation of said semiconductor substrate when the source and drain regions are being formed by means of said oblique angle ion implant beam.

9. The method of claim 1 wherein said large angle ion implantation uses arsenic with a dose of between about $1 \times 10^{15}$ and $8 \times 10^{15}$ ions/cm$^2$ at between about 30 and 100 keV.

10. The method of claim 1 wherein said normally directed ion implantation uses phosphorous or arsenic with a dose of between about $1 \times 10^{13}$ and $1 \times 10^{14}$ ions/cm$^2$ at between about 30 and 50 keV.

11. The method of claim 1 wherein said tunnel oxide layer and said self-aligned oxide layer are formed using the same thermal oxidation at between about 800° C. and 950° C.

12. The method of claim 11 wherein said tunnel oxide layer is between about 60 and 100 Angstroms thick.

13. The method of claim 11 wherein said self-aligned oxide layer is between about 200 and 500 Angstroms thick.

14. The method of claim 11 wherein the width of said tunnel oxide layer is between about 0.1 and 0.3 microns.

* * * * *